(12) United States Patent
Dray et al.

(10) Patent No.: US 6,707,697 B2
(45) Date of Patent: Mar. 16, 2004

(54) FAMOS TYPE NON-VOLATILE MEMORY

(75) Inventors: Cyrille Dray, Grenoble (FR); Richard Fournel, Lumbin (FR)

(73) Assignee: STMicroelectronics SA, Montrouge (FR)

( * ) Notice: Subject to any disclaimer, the term of this patent is extended or adjusted under 35 U.S.C. 154(b) by 110 days.

(21) Appl. No.: 10/126,442

(22) Filed: Apr. 19, 2002

(65) Prior Publication Data

US 2002/0175353 A1 Nov. 28, 2002

(30) Foreign Application Priority Data

Apr. 20, 2001 (FR) .............................. 01 05343

(51) Int. Cl.⁷ .............................................. G11C 17/00
(52) U.S. Cl. ..................... 365/104; 365/188; 365/187
(58) Field of Search .................... 365/104, 182, 365/187, 188

(56) References Cited

U.S. PATENT DOCUMENTS 3,609,710 A * 9/1971 Browne ....................... 365/49
4,566,025 A * 1/1986 Jastrzebski et al. ......... 365/182
5,641,989 A 6/1997 Tomioka ..................... 257/630
5,973,354 A 10/1999 Chang ........................ 257/315

FOREIGN PATENT DOCUMENTS

DE 19923259 1/2000 ......... H01L/27/115
EP 0609829 8/1994 ......... H01L/29/788

* cited by examiner

Primary Examiner—Thong Le
(74) Attorney, Agent, or Firm—Allen, Dyer, Doppelt, Milbrath & Gilchrist, P.A.; Lisa K. Jorgenson

(57) ABSTRACT

An FAMOS memory includes memory cells, with each memory cell including an insulated gate transistor, and a first access transistor having a drain connected to a source of the insulated gate transistor. The FAMOS memory also includes an insulation transistor having a drain and a source respectively connected to the source of the insulated gate transistors of two adjacent cells of a same row. Each insulated gate transistor has a ring structure, and a ladder-shaped separation region insulates the cells of the same row.

37 Claims, 1 Drawing Sheet

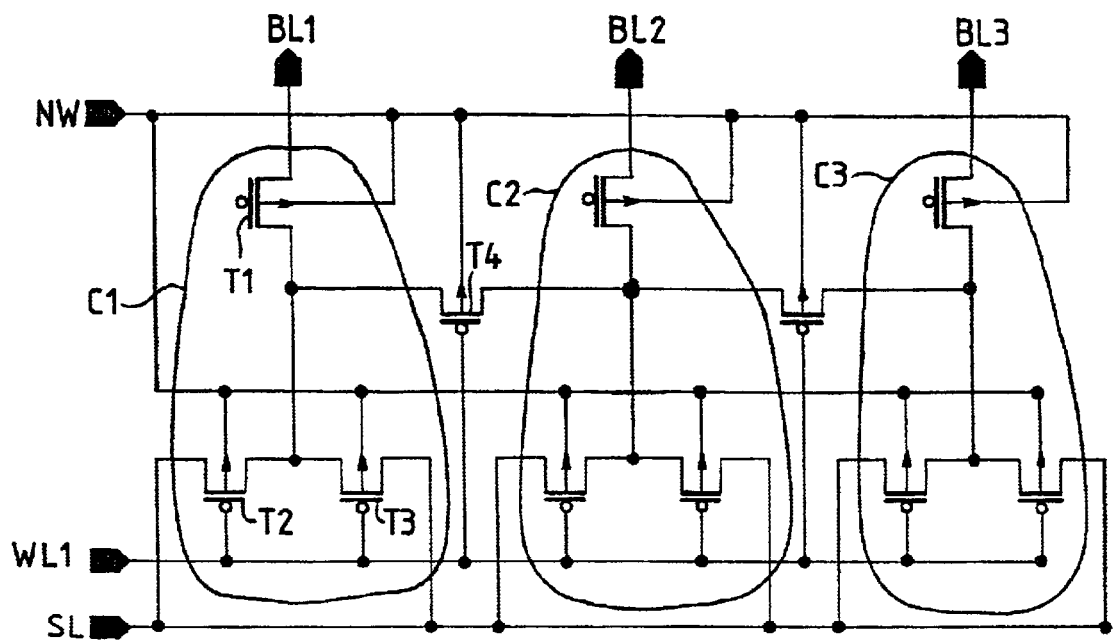
FIG_1
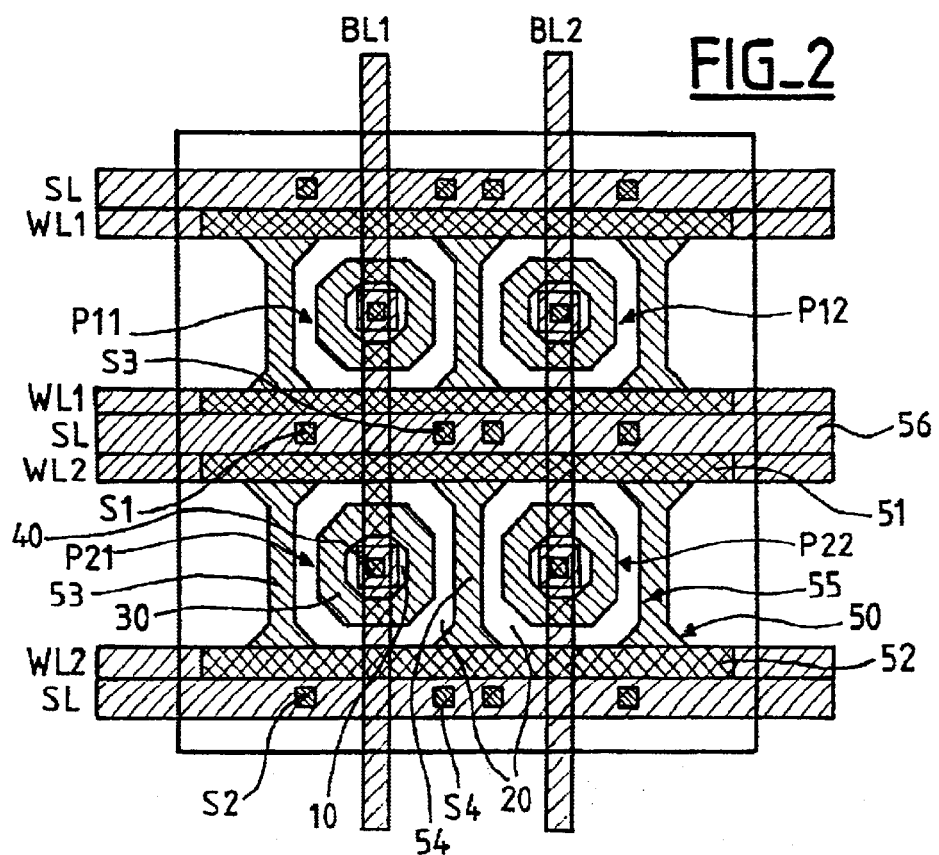
FIG_2

FAMOS TYPE NON-VOLATILE MEMORY

FIELD OF THE INVENTION

The present invention relates to an electrically programmable non-volatile memory and to an integrated circuit comprising a memory of this kind. More specifically, the present invention relates to a non-volatile memory using field avalanche metal oxide semiconductor (FAMOS) technology, which uses a natural memory cell obtained with a P-type MOS transistor whose single gate is electrically insulated.

BACKGROUND OF THE INVENTION

A natural memory cell is obtained without adding complementary steps to the basic process for the manufacture of a P-type MOS transistor. In particular, it has only one polysilicon level unlike the other types of known memories, for example, EPROM or EEPROM type memory cells. Since the gate of an FAMOS transistor is not connected, it is not possible to electrically erase an FAMOS memory cell. For this reason, ultraviolet rays have to be used. A memory cell of this kind is therefore used more particularly as a one-time programmable (OTP) memory.

An FAMOS type memory cell can be distinguished simply from a classic P-type transistor by the fact that its single gate is not electrically connected. An FAMOS memory cell is programmed, for example, by applying a programming voltage VPP of about 5 V to its source for about 500 μs, with its drain being connected to ground. The gate potential then rises by capacitive coupling between, first, the gate and, second, the source and the well. Hot electrons are created at the drain and these electrons are injected into the gate.

In the blank state (or the state when it is erased by UV rays), the FAMOS memory cell has a threshold voltage VT1 of about −0.6 V. When it is programmed, its threshold voltage VT2 reaches about 1 V.

A memory cell is read by measuring the current flowing between its source and its drain when a voltage ranging from a few hundred millivolts to a few volts is applied between its source and its drain. For example, a read voltage of about 3.3 V is applied to its source and a power supply voltage of about 2.3 V is applied to its drain. Read and write access to the memory cell is obtained in a known way by an access transistor series-connected with a memory cell.

To make a memory, several memory cells are used. These memory cells are associated in a memory array comprising a set of rows and a set of columns. Each row forms a word of several bits. All the memory cells of the same word are connected together to the same word line, and all the memory cells of the same column are connected together to the same bit line. It is possible to select each memory cell by choosing a word line and a bit line. French Patent No. FR 10286 describes an exemplary embodiment of an FAMOS memory.

One problem that arises when making a memory is that of insulating the memory cells from one another. Another problem is the speed of programming or reading a memory cell. This speed is limited by the size of the access transistor associated with the memory cell to be programmed or read.

There are known ways of using a field oxide zone or region to insulate two active elements of an integrated circuit. The field oxide region may be deposited by several methods, such as the LOCOS (local oxidation) method or the STI (shallow trench insulation) method.

The STI method is advantageous because it can be used to obtain thin field oxides. However, this method creates brittle regions, more commonly known as birds' beaks, at the interface between the gate and insulator. This method also raises risks of the dislocation of the silicon at the interface between the field oxide and the active region.

The brittle regions or regions of dislocation essentially reduce the time during which data is held in the FAMOS transistor. Furthermore, regardless of the method used, the depositing of a field oxide requires an additional step in the general method of manufacture of the memory.

Details on insulation by field oxide deposition, its advantages and its drawbacks as well as information on what is called the bird's beak phenomenon are specified in the French Patent No. FR 10287. To resolve the problem of the time during which data is held in the FAMOS transistor, the French Patent No. FR 10287 discloses the use of a memory cell having a ring structure, i.e., the active elements of the memory cell are made in concentric forms.

Such a structure has the advantage of not using field oxide to separate the active elements of the FAMOS transistor. There are therefore no bird's beak type phenomena with such a structure. This approach is useful for making a FAMOS memory cell but cannot be used for making a memory. Indeed, it is hard to make a set of concentric memory cells, especially if there are a large number of memory cells to be made.

SUMMARY OF THE INVENTION

In view of the foregoing background, an object of the present invention is to insulate the memory cells of a FAMOS memory without using the field oxide, so as not to create regions of brittleness that could give rise to the dislocation phenomena.

Another object of the present invention is to increase the speed of programming or reading a memory cell of the memory.

Yet another object of the present invention is to provide a memory structure such that it has no regions of brittleness that could give rise to a bird's beak type of phenomenon.

These and other objects, advantages and features according to the present invention are provided by a FAMOS memory comprising at least one first cell and one second cell, with the first and second cells each comprising a transistor whose single gate is insulated. A first access transistor having a diffusion region is connected to a diffusion region of the insulated gate transistor.

The memory also comprises an insulation transistor for which a diffusion region is connected, first, to the diffusion region of the insulated gate transistor of the first cell and, second, to the diffusion region of the insulated gate transistor of the second cell. It will be recalled that the ends of a diffusion region form the drain and the source of a transistor.

Thus, a memory according to the invention comprises an insulation transistor placed between two memory cells of the same row of the memory. A memory according to the invention therefore does not include any insulator in the form of a field oxide. The risk of the dislocation phenomena appearing, and hence the risk of a reduction in the time during which data is held in the memory are thus eliminated.

Furthermore, connecting the gate of the insulated transistor and the gates of the access transistor of the first cell and of the second cell makes the insulation transistor become conductive at the same time as the access transistors. When it is on, the insulation transistor is equivalent to a wire and all the access transistors of the first cell and of the second cell are parallel connected and their effects are added together, i.e., they become equivalent to a single access transistor with a far greater size (in terms of gate width/length ratio). The consequence of this is that the speed of access to the insulated gate transistor of one of the cells is increased. The duration of a programming operation or read operation in this transistor is therefore reduced accordingly, and the programming or reading quality is thereby improved.

The invention preferably uses only one type of transistor, in this case, P-type transistors. The making of the memory is thus facilitated. According to one embodiment of the invention, the first cell and/or the second cell also each comprise a second access transistor, having a gate, a source and a drain respectively connected to a gate, a source and a drain of the first access transistor.

In a same cell, the first access transistor and the second access transistor are parallel connected, and their effects are added together. Consequently, the speed of access to the associated isolated gate transistor is further increased.

In the first cell and/or in the second cell a drain of the insulated gate transistor is connected to an associated bit line, and the gate of the access transistors are connected to an associated word line. The source of the access transistors are connected to a power supply line, and the drain of the access transistors are connected to the source of the insulated gate transistor. Thus, by applying appropriate voltages to the power supply line, on a bit line and on a word line, it is possible to read or program an associated insulated gate transistor.

Preferably, the insulation transistor and the access transistors for all the cells have a common gate. In this case, all these transistors may be controlled together. Preferably, the insulated gate transistor of the first cell or the second cell has a ring structure comprising a central diffusion region, a peripheral diffusion region and a polysilicon region located between the central diffusion region and the peripheral diffusion region.

A memory according to the invention thus derives all the advantages related to the ring structure of an FAMOS transistor. For example, the invention eliminates the risk of creation of brittle regions and further increases the data holding time.

Furthermore, due to its ring structure, the surface of the drain of the insulated gate transistor, and hence the junction area of this drain with the associated bit line is reduced. The junction capacity of such a transistor is thus about three times smaller than the junction capacity of a linear transistor having the same W/L size (in terms of the gate width/length ratio).

It is possible to choose an insulated gate transistor with a large W/L ratio inasmuch as its junction capacity is smaller than that of an equivalent linear transistor. The reading time of the transistor is thus reduced and the quality of the reading is improved. Another advantage of the ring structure is that it reduces the leakage currents.

More generally, a memory according to the invention comprises M*N insulated gate transistors in a ring structure, distributed in N rows of M columns. The insulated gate transistors comprise a central diffusion region forming a drain and a peripheral diffusion region forming a source. All the insulated gate transistors of the same column have their drain connected together to the same bit line.

For each row, a separation region separates the M insulated gate transistors of the row. For each row, the separation region has a ladder shape and comprises a first upright located substantially parallel to an axis of the M insulated gate transistors and bordering the peripheral diffusion region of the M insulated gate transistors. Each row also comprises a second upright symmetrical with the first upright, with respect to the axis of the M insulated gate transistors. M−1 rungs or steps are perpendicular to the first upright and the second upright, with each step being located between two adjacent insulated gate transistors and between the first upright and the second upright.

The peripheral diffusion region of the m ranking insulated gate transistor, with m being an integer ranging from 1 to M−1, the m ranking step, and the peripheral diffusion region of the m+1 ranking insulated gate transistor form an insulation transistor.

Similarly, the separation region of the n ranking row and the separation region of the n+1 ranking row, with n being an integer ranging from 1 to N−1, have a same contact line in common. This contact line is located between the second upright of the separation region of the n ranking row and the first upright of the separation region of the n+1 ranking row.

The peripheral diffusion region of the $m^{th}$ insulated gate transistor of the nth row, the second upright of the separation region of the n ranking row and a diffusion region connected to the contact line by a contact point respectively form the drain, the gate and the source of an access transistor associated with the $m^{th}$ insulated gate transistor of the $n^{th}$ row.

Symmetrically, the diffusion region connected to the contact line by the contact point, the first upright of the separation region of the n+1 ranking row and the peripheral diffusion region of the $m^{th}$ insulated gate transistor of the $(n+1)^{th}$ row, respectively form the drain, the gate and the source of an access transistor associated with the $m^{th}$ insulated gate transistor of the $(n+1)^{th}$ row.

BRIEF DESCRIPTION OF THE DRAWINGS

The invention will be understood more clearly and other features and advantages shall appear from the following description of an exemplary embodiment of an FAMOS type non-volatile memory according to the present invention. The description must be read with reference to the appended drawings, of which:

FIG. 1 is a schematic diagram of a memory array of a memory according to the present invention; and FIG. 2 shows an implementation of a memory array of a memory according to the present invention.

DETAILED DESCRIPTION OF THE PREFERRED EMBODIMENTS

For the sake of simplification, the expression FAMOS transistor shall be used to refer to a P-type transistor whose single gate is electrically insulated. Similarly, the terms FAMOS cell and FAMOS memory will respectively designate a memory cell using an FAMOS transistor and a memory comprising at least one FAMOS memory cell.

FIG. 1 shows the memory array of an FAMOS memory comprising three memory cells C1, C2, C3 associated with the same word line. The memory cell C1 comprises a FAMOS transistor T1, and two access transistors T2, T3. Each transistor comprises a drain, a source and a gate. The gate of the FAMOS transistor T1 is electrically insulated and its drain is connected to a first bit line BL1 associated with the memory cell C1. The drains of the access transistors T2, T3 are connected together to the source of the FAMOS transistor T1, and the sources of the access transistors T2, T3 are connected together to a common power supply line SL. The gates of the access transistors are connected together to a word line WL1.

The purpose of the access transistors is to be able to select a desired memory cell. All the memory cells C2, C3 of the memory array are identical to the cell C1. The sources of the access transistors T2, T3 of the cells C2, C3 are connected together to the common power supply line SL, and the gates of the access transistors of cells C2, C3 are connected together to the word line WL1. On the contrary, the drain of the FAMOS transistor of the cell C2 is connected to a second bit line BL2, and the drain of the FAMOS transistor of the cell C3 is connected to a third bit line BL3.

The cell C1 is insulated from the adjacent cell C2 by an insulation transistor T4. The source of T4 is connected to the source of the FAMOS transistor of the cell C1, the drain of T4 is connected to the source of the FAMOS transistor of the cell C2, and the gate of the transistor T4 is connected to the word line. The source and the drain of the transistor T4 may be inverted, as a function of the voltages applied to these electrodes. Similarly, the cell C2 and the cell C3 are insulated from one another by an insulation transistor identical to the transistor T4 which is connected in a similar way.

All the transistors of the memory array (FAMOS transistors, access transistors and insulation transistors) are P-type transistors. Each of them has a bulk connection. All the bulk connections of all the transistors are connected together to the same well power supply line.

In addition to the memory array, a memory according to the invention comprises of course, row and/or column selection devices, power supply devices and switching devices to apply the voltages needed for the programming or reading of a memory cell. These devices are not all shown FIG. 1 because they are well known.

Operation of the memory array of FIG. 1 shall now be described below in the case where a programming, and then a reading of the cell C2 are performed. It is assumed here that the cell C2 is initially a blank cell or an erased cell. To program the cell C2, a voltage equal to a supply voltage VDD (about 3.3 V) is applied to the bit line BL2 associated with the cell C2, a programming voltage VPP (in the range of five volts) is applied to the power supply line SL and the bit lines BL1, BL3.

The transistors T2, T3 of all the memory cells C1 to C3 thus have the power supply voltage VDD at their gate and the programming voltage VPP at their source. They are therefore all on and the voltage VPP appears at their drain. The insulation transistors T4 receive the voltage VDD at their gate, and the voltage VPP at their drain and their source. They are also in the conductive state and operate like a short-circuit wire. Consequently, all the transistors T2, T3 of all the cells C1 to C3 are equivalent to a single access transistor whose size (in terms of the gate width/length ratio) is far greater than the size of all the individual transistors T2, T3 of all the cells C1 to C3.

Thus, regardless of the cell to be accessed, the current in the access transistor is large. Consequently, the voltage drop at the terminals of the access transistor is low and the highest possible voltage is applied to the drain of the FAMOS transistor of the cell to be programmed. The programming is thus more efficient.

Furthermore, the FAMOS transistor of the cell C2 receives zero voltage at its drain and the voltage VPP at its source. Since the voltage difference between its drain and its source is in the range of −VPP, the insulated gate of the FAMOS transistor of the cell C2 is charged. The cell C2 is thus programmed.

However, the FAMOS transistors of the cells C1, C3 receive the voltage VPP at their drain and at their source. No charge transfer takes place between the gate and the source of these transistors, and their state (programmed or blank or erased state) remains unchanged. Conversely, to read the cell C2, zero voltage is applied to the word line WL1 and a read voltage VR (of about 2.3 V) is applied to the bit line BL2. The power supply voltage VDD is applied to the bit lines BL1, BL3 and to the power supply line SL.

The transistors T2, T3 of all the memory cells C1 to C3 thus have zero voltage at their gate and the power supply voltage VDD at their source. They are therefore all on and the voltage VDD appears at the drains of all the transistors T2, T3 of all the FAMOS cells. The insulation transistors T4 receive zero voltage at their gate and the voltage VDD at their drain and their source. They are also in the conductive state and operate, as above, like a short-circuit wire.

Furthermore, the FAMOS transistor of the cell C2 receives the read voltage VR at its drain and the power supply voltage VDD at its source. Since the difference in voltage between the drain and the source of the FAMOS transistor of the cell C2 is about 1 V, the cell C2 is read. However, the FAMOS transistors of the cells C1, C3 receive the voltage VDD at their drain and at their source. No reading of these cells can therefore be carried out, nor can any involuntary programming be carried out. It also possible to carry out a reading of the cell C2 while leaving the lines BL1, BL3 in a floating state.

FIG. 2 shows an exemplary implementation of a memory according to the invention comprising four FAMOS transistors P11, P12, P21 and P22 in a ring arrangement distributed on two rows and two columns. To implement the transistor P21, a central diffusion region 10 forming the drain of the FAMOS transistor, and a peripheral diffusion region 20 forming the source of the FAMOS transistor are made. A polysilicon region 30, included between the central diffusion region 10 and the peripheral diffusion region 20, forms the gate of the FAMOS transistor P21.

An electrical contact 40 is also made to connect the drain (the central region 10) to a bit line BL1 associated with the transistor P21. The FAMOS transistors P11, P12, P21, P22 all have a ring-like arrangement and are formed identically. The drains of the transistors P11 and P21 are connected to the bit line BL1, and the drains of the transistors P12 and P22 are connected to the bit line BL2.

A polysilicon separation region 50 separates the FAMOS transistors P21 to P22 of the second row of transistors. The region 50 substantially resembles a ladder with two uprights 51, 52 and rungs or steps 53, 54, 55 perpendicular to the uprights 51, 52, which are electrically connected to the associated word line WL2.

In the same way, another similarly shaped region 50 separates the transistors P11, P12 of the first row of transistors, and the uprights of this other region 50 are connected to the word line WL1. The regions 50 themselves have a metal contact line 56 in common. This contact line 56 is connected to the power supply line SL.

Each step of the ladder-shaped region 50 forms the gate of an insulation transistor (corresponding to the transistor T4 in FIG. 1). For example, the step 54 forms the gate of a transistor T4, while the source 20 of the FAMOS transistor P21 and the source 20 of the FAMOS transistor P22 form the drain and the source of the transistor T4. The step (and the transistor that it forms) thus provides for the insulation between the transistors P21 and P22.

Furthermore, each upright 51, 52 forms a gate common to all the access transistors T2, T3 of all the FAMOS transistors P21, P22 of the same word. The drain of an access transistor T2 or T3 corresponds to the source of the associated FAMOS transistor (in this case P21 or P22). The source of the access transistor T2 or T3 corresponds to a diffusion region (not shown in FIG. 2) connected to a contact line SL (contact points S1 to S4).

In other words, the contact points S1, S3, the upright 51 and the source 20 of the FAMOS transistor P21 form an access transistor. Similarly, the contact points S2, S4, the upright 52 and source 20 of the FAMOS transistor P21 form another access transistor. These two transistors are parallel connected from an electrical point of view and form the access transistors T2, T3 of FIG. 1.

The implementation of a memory according to the drawing of FIG. 2 does not require the use of a field oxide to obtain electrical insulation between two active elements of the memory array. The electrical insulation is obtained by P-type transistors.

Furthermore, all the access transistors of the same memory word have a common gate (uprights 51,52) and a common source (contact line 56). Consequently, all the access transistors of the same word are electrically equivalent to a single transistor with a far greater size. This results in much faster access to one of the FAMOS transistors of the word considered. The programming or reading of the transistor is thus faster and of better quality.

Thus, the same polysilicon region 50 with a special shape, namely the ladder shape in the example of FIG. 2, is used to make, first, insulation transistors designed to electrically insulate the FAMOS transistors of a same word from one another and, second, large-sized access transistors to obtain very fast access to a selected FAMOS transistor.

Since the access transistors are P-type transistors and since they have a common power supply gate (for the transistors of the same row), it is not necessary to have high current available on a word line of the memory. Thus, the size of the auxiliary circuits, such as, for example, the high-voltage switches used to power a word line, is reduced.

That which is claimed is:

1. A field avalanche metal oxide semiconductor (FAMOS) memory comprising:
    at least one first cell and at least one second cell, each cell comprising
        an insulated gate transistor comprising an insulated gate and a first diffusion region, and
        a first access transistor comprising a first diffusion region connected to the first diffusion region of said insulated gate transistor; and
    at least one insulation transistor comprising a first diffusion region connected to the first diffusion region of said insulated gate transistor of said first cell, and a second diffusion region connected to the first diffusion region of said insulated gate transistor of said second cell.

2. An FAMOS memory according to claim 1, wherein the first diffusion region of each first access transistor forms a drain end each first access transistor further comprises a gate and a source; and wherein each cell further comprises a second access transistor comprising a gate, a source and a drain connected respectively to the gate, the source and the drain of said first access transistor.

3. An FAMOS memory according to claim 2, wherein the first diffusion region of each insulated gate transistor forms a source, and each insulated gate transistor further comprises a drain connected to an associated bit line.

4. An FAMOS memory according to claim 3, wherein the gates of said first and second access transistor, are connected to an associated word line; wherein the sources of said first and second access transistors are connected to a power supply line; and wherein the drains of said first and second access transistor are connected to the source of said insulated gate transistor.

5. An FAMOS memory according to claim 2, whrein said at least one insulation transistor comprises a gate connected in common to the gates of said first and second access transistors.

6. An FAMOS memory according to claim 2, wherein said at least one insulation transistor, and said insulated gate transistor and said first and second access transistors of said at least one first and second cells are formed in a same bulk, and wherein bulk connections thereof are connected together.

7. An FAMOS memory according to claim 2, wherein each insulated gate transistor has a ring structure comprising a central diffusion region forming the first diffusion region, a peripheral diffusion region, and a polysilicon region therebetween forming the insulated gate.

8. An FAMOS memory according to claim 7, further comprising a separation region comprising at least one step substantially perpendicular to an axis passing through a center of said at least one first and second cells, said at least one step between the peripheral diffusion region of said at least one first cell and the peripheral diffusion region of said at least one second cells and wherein the peripheral diffusion region of said at least one first cell forms the first diffusion region of said at least one insulation transistor, the peripheral diffusion region of said at least one second cell forming the second diffusion region of said at least one insulation transistor, and said at least one step forms a gate of said at least one insulation transistor.

9. An FAMOS memory according to claim 8, wherein the peripheral diffusion region of said at least one first cell forms a source of said insulation transistor, and the peripheral diffusion region of said at least one second cell forms a drain of said at least one insulation transistor.

10. An FAMOS memory according to claim 8, further comprising at least one first contact line; wherein the separation region further comprises a first upright substantially parallel to the axis of said at least one first and second cells, and said first upright is between an edge of the peripheral diffusion region of said at least one first and second cells and said at least one first contact line.

11. An FAMOS memory according to claim 10, wherein said at least one first contact line comprises a plurality of contact point, and at least one diffusion region connected thereto via one of said plurality of contact points; and wherein the peripheral diffusion region of said at least one first cell, the first upright and the diffusion region connected to said at least one first contact line respectively forms the drain, the gate and the source of said first access transistor of said first cell.

12. An FAMOS memory according to claim 10, further comprising at least one second contact line; wherein the separation region further comprises a second upright substantially parallel to the axis of said at least one first and second cells, and said second upright is symmetrical to the first upright and between an edge of the peripheral diffusion region of said at least one first and second cells and said at least one second contact line.

13. An FAMOS memory according to claim 12, wherein said at least one second contact line comprises a plurality of contact points, and at least one diffusion region connected thereto via one of said plurality of contact points; and wherein the peripheral diffusion region of said at least one first cell, the second upright and the diffusion region connected to said at least one second contact line respectively forms the drain, the gate and the source of said second access transistor of said first cell.

14. A field avalanche metal oxide semiconductor (FAMOS) memory comprising:
at least one first cell and at least one second call, each cell comprising
an insulated gate transistor comprising an insulated gate and a source,
a first access transistor comprising a gate, a source, and a drain connected to the source of said insulated gate transistor, and
a second access transistor comprising a gate, a source and a drain connected respectively to the gate, the source and the drain of said first access transistor; and
at least one insulation transistor between said at 1east one first and second cells, each insulation transistor comprising a gate connected in common to the gates of said first and second access transistor.

15. An FAMOS memory according to claim 14, wherein each insulated gate transistor further comprises a drain connected to an associated bit line.

16. An FAMOS memory according to claim 14, wherein the gates of said first and second access transistors are connected to an associated word line; and wherein the sources of said first and second access transistors are connected to a power supply lines.

17. An FAMOS memory according to claim 14, wherein said at least one insulation transistor, and said insulated gate transistor and said first and second access transistors of said at one first and second cells are formed in a same bulk, and wherein bulk connections thereof are connected together.

18. An FAMOS memory according to claim 14, wherein each insulated gate transistor has a ring structure comprising a central diffusion region forming the drain, a peripheral diffusion region forming the source, and a polysilicon region therebetween forming the insulated gate.

19. An FAMOS memory according to claim 18, further comprising a separation region comprising at least one step substantially perpendicular to an axis passing through a center of said at least one first and second cells, said at least one step between the peripheral diffusion region of said at least one first cell and the peripheral diffusion region of said at least one second cell; and wherein the peripheral diffusion region of said at least one first cell forms the source of said at least one insulation transistor, the peripheral diffusion region of said at least one second cell forming the drain of said at least one insulation transistor, and said at least one step forms the gate of said at least one insulation transistor.

20. An FAMOS memory according to claim 19, further comprising at least one first contact line; wherein the separatior region further comprises a first upright substantially parallel to the axis of said at least one first and second cells, and said first upright is between an edge of the peripheral diffusion region of said at least one first and second cells and said at least one first contact line.

21. An FAMOS memory according to claim 20, wherein said at least one first contact line comprises a plurality of contact points, and at least one diffusion region connected thereto via one of said plurality of contact points; and wherein the peripheral diffusion region of said at least one first cell, the first upright and the diffusion region connected to said at least one first contact line respectively forms the gate, the gate and the source of said first access transistor of said first cell.

22. FAMOS memory according to claim 20, further comprising at least one second contact line; wherein the separation region further comprises a second upright substantially parallel to the axis of said at least one first and second cells, and said second upright is symmetrical to the first upright and between an edge of the peripheral diffusion region of said at least one first and second calls and said at least one second contact line.

23. An FAMOS memory according to claim 22, wherein said at least one second contact line comprises a plurality of contact points, and at least one diffusion region connected thereto via one of said plurality of contact points; and wherein the peripheral diffusion region of said at least one first cell, the second upright and the diffusion region connected to said at least one second contact line respectively forms the drain, the gate and the source or said second access transistor of said first call.

24. A field avalanche metal oxide semiconductor (FAMOS) memory comprising:
M*N insulated gate transistors in a ring structure and being distributed in N rows of M columns, each insulated gate transistors comprising a central diffusion region forming a drain and a peripheral diffusion region forming a source, and the drains at said insulated gate transistors of a same column being connected together to a same bit line;
a plurality of separation regions for each row for separating said M insulated gate transistors, each separation region having a ladder shape and comprising
a first upright substantially parallel to an axis of said M insulated gate transistors and bordering the peripheral diffusion regions of said H insulated gate transistors,
a second upright symmetrical to said first upright with respect to the axis of said M insulated gate transistors, and
M−1 steps perpendicular to the first and second uprights, each step between two adjacent insulated gate transistors and between the first and second uprights; and
the peripheral diffusion region of an $m^{th}$ ranking insulated gate transistor, an $m^{th}$ ranking step, and the peripheral diffusion region of an $(m+1)^{th}$ ranking insulated gets transistor forming an insulation transistor, with m being an integer ranging from 1 to M−1.

25. An FAMOS memory according to claim 24, further comprising a plurality of contact lines with contact points therein; and wherein the separation region of an $n^{th}$ ranking row and the separation region of an $(n+1)^{th}$ ranking row have a same contact line in common between the second upright of the separation region of the $n^{th}$ ranking row and the first upright of the separation region of the $(n+1)^{th}$ ranking row, with n being an integer ranging from 1 to N+1.

26. An FAMOS memory according to claim 25, wherein the peripheral diffusion region of an $m^{th}$ insulated gate transistor of the $n^{th}$ ranking row, the and upright of the separation region of the $n^{th}$ ranking row and a diffusion region connected to a respective contact line by the contact points therein respectively forms a drain, a gate and a source of an access transistor associated with the $m^{th}$ insulated gate transistor of the $n^{th}$ ranking row.

27. An FAMOS memory according to claim 25, wherein the diffusion region connected to the respective contact line by the contact points, the first upright of the separation region of the $(n+1)^{th}$ ranking row and the peripheral diffusion region of the $m^{th}$ insulated gate transistor of the $(n+1)^{th}$ row respectively forms the drain, the gate and the source of an access transistor associated with the m$^{th}$ insulated gate transistor of the (n$^1$)$^{th}$ row.

28. A method for making a field avalanche metal oxide semiconductor (FAMOS) memory comprising:
forming at least one first cell and at least one second cell, each cell comprising
an insulated gate transistor comprising an insulated gate and a source,
a first access transistor comprising a gate, a source, and a drain connected to the source of the insulated gate transistor, and
a second access transistor comprising a gate, a source and a drain connected respectively to the gate, the source and the drain of the first access transistor; and
forming an insulation transistor between the at least one first and second cells, each insulation transistor comprising a gate connected in common to the gates of the first and second access transistors.

29. A method according to claim 28, wherein each insulated late transistor further comprises a drain connected to an associated bit line.

30. A method according to claim 28, wherein the gate of the first and second access transistors are connected to an associated word line; and wherein the sources of the first and second access transistors are connected to a power supply line.

31. A method according to claim 28, wherein the at least one insulation transistor, and the insulated gate transistor and the first and second access transistors of the at least one first and second cells are formed in a same bulk, and wherein bulk connections thereof are connected together.

32. A method according to claim 28, wherein each insulated gate transistor has a ring structure comprising a central diffusion region forming the drain, a peripheral diffusion region the source, and a polysilicon region therebetween forming the insulated gate.

33. A method according to claim 32, wherein the FAMOS memory further comprises a separation region comprising at least one step substantially perpendicular to an axis passing through a center of the at least one first and second cells, the at least one step between the peripheral diffusion region of the at least one first cell and the peripheral diffusion region of the at least one second cell; and wherein the peripheral diffusion region of the at least one first cell terms the source of the at least one insulation transistor, the peripheral diffusion region of the at least one second cell forms the drain of the at least one insulation transistor, and the at least one step forms the gate of the at least one insulation transistor.

34. A method according to claim 33, wherein the FAMOS memory further comprises at least one first contact line; wherein the separation region further comprises a first upright substantially parallel to the axis of the at least one first and second cells, and the first upright is between an edge of the peripheral diffusion region of the at least one first and second cells and the at least one first contact line.

35. A method according to claim 34, wherein the at least one first contact line comprises a plurality of contact points, and at least one diffusion region connected thereto via one of the plurality of contact points; and wherein the peripheral diffusion region of the at least one first cell, the first upright and the diffusion region connected to the at least one first contact line respectively forms the drain, the gate and the source of the first access transistor of the first cell.

36. A method according to claim 34, wherein the FAMOS memory further comprises further comprises at least one second contact line; wherein the separation region further comprises a second upright substantially parallel to the axis of the at least one first and second cells, and the second upright is symmetrical to the first upright and is between an edge of the peripheral diffusion region of the at least one first and second cells and the at least one second contact line.

37. A method according to claim 36, wherein the at least one second contract line comprises a plurality of contact points, and at least one diffusion region connected thereto via one of the plurality of contact points; and wherein the peripheral diffusion region of the at least one first cell, the second upright and the diffusion region connected to the at least one second contact line respectively forms the drain, the gate and the source of the second access transistor of the first cell.

* * * * *

UNITED STATES PATENT AND TRADEMARK OFFICE
CERTIFICATE OF CORRECTION

PATENT NO. : 6,707,697 B2  
APPLICATION NO. : 10/126442  
DATED : March 16, 2004  
INVENTOR(S) : Cyrille Dray and Richard Fournel It is certified that error appears in the above-identified patent and that said Letters Patent is hereby corrected as shown below:

| | |
|---|---|
| Column 9, Line 18 | Delete: "at 1east" <br> Insert: -- at least -- |
| Column 10, Line 17 | Delete: "call" <br> Insert: -- cell -- |
| Column 10, Line 53 | Delete: "N+1" <br> Insert: -- N–1 -- |
| Column 11, Line 2 | Delete: "$(n^1)^{th}$," <br> Insert: -- $(n+1)^{th}$ -- |
| Column 12, Line 24 | Delete: "further comprises further comprises" <br> Insert: -- further comprises -- |

Signed and Sealed this

Twenty-fifth Day of December, 2007

JON W. DUDAS  
*Director of the United States Patent and Trademark Office*